US006974523B2

(12) United States Patent
Benzing et al.

(10) Patent No.: US 6,974,523 B2
(45) Date of Patent: Dec. 13, 2005

(54) HOLLOW ANODE PLASMA REACTOR AND METHOD

(75) Inventors: David W. Benzing, San Jose, CA (US); Babak Kadkhodayan, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 369 days.

(21) Appl. No.: 09/859,091

(22) Filed: May 16, 2001

(65) Prior Publication Data
US 2002/0170881 A1 Nov. 21, 2002

(51) Int. Cl.$^7$ ............................................. H01L 21/00
(52) U.S. Cl. ............................ 156/345.47; 156/345.43
(58) Field of Search ..................... 156/345.43, 345.44, 156/345.45, 345.46, 345.47, 916; 118/723 E, 118/723 R

(56) References Cited

U.S. PATENT DOCUMENTS

| 4,633,809 | A | | 1/1987 | Hirose et al. |
| 4,954,201 | A | | 9/1990 | Latz et al. |
| 5,099,100 | A | * | 3/1992 | Bersin et al. ............. 219/121.4 |
| 5,210,055 | A | * | 5/1993 | Nakaguma et al. ......... 438/710 |
| 5,292,399 | A | * | 3/1994 | Lee et al. .................... 438/716 |
| 5,647,912 | A | * | 7/1997 | Kaminishizono et al. ... 118/719 |
| 5,685,949 | A | * | 11/1997 | Yashima ..................... 438/694 |
| 5,865,896 | A | * | 2/1999 | Nowak et al. ............. 118/723 I |
| 6,008,130 | A | * | 12/1999 | Henderson et al. ......... 438/710 |
| 6,074,518 | A | | 6/2000 | Imafuku et al. |
| 6,089,181 | A | * | 7/2000 | Suemasa et al. ......... 118/723 E |
| 6,170,429 | B1 | * | 1/2001 | Schoepp et al. ........ 118/723 R |
| 6,178,919 | B1 | | 1/2001 | Li et al. |
| 6,387,817 | B1 | * | 5/2002 | Buckfeller .................. 438/712 |

FOREIGN PATENT DOCUMENTS

| EP | 0 821 395 A2 | | 1/1998 | |
| WO | WO 00/39837 | * | 7/2000 | ............ H01J 37/32 |

* cited by examiner

*Primary Examiner*—Parviz Hassanzadeh
*Assistant Examiner*—Michelle Crowell
(74) *Attorney, Agent, or Firm*—Brinks Hofer Gilson & Lione

(57) ABSTRACT

The plasma processing apparatus includes a plasma chamber, a first electrode, a second electrode, and a plasma containment device. The plasma containment device has a plurality of slots and is electrically coupled to the first electrode. The containment device is configured to confine plasma within an inter-electrode volume while facilitating maximum process gas flow. When plasma is generated by applying electric fields to process gas within the inter-electrode volume, the containment device electrically confines the plasma to the inter-electrode volume without significantly restricting the flow of gas from the inter-electrode volume.

37 Claims, 10 Drawing Sheets

HOLLOW ANODE PLASMA REACTOR AND METHOD

FIELD OF THE INVENTION

This invention relates to the fabrication of integrated circuits, and more particularly, to an apparatus and a method that remove materials from a surface.

BACKGROUND

A dry etch process may be used in semiconductor wafer processing to remove materials from a surface of a wafer, or from films deposited on a wafer by exposure to plasma. Plasma is an electrically neutral, partially ionized phase of matter. An etch reactor not only produces plasma, but also provides a degree of control of the chemical and physical reactions that occur on the wafer or film surface. Through the etch process, materials are removed from the wafer or film surface in an etching area to form profiles and dimensions that, in part, define circuit elements.

In a known plasma reactor, the plasma is produced in a volume proximate to the wafer and expands to fill most or all of the total reactor chamber volume. The plasma interacts with all of the surfaces the plasma contacts. Outside the proximate wafer volume, the plasma-wall interactions can yield undesirable results such as a sputtering of wall material or more commonly, a deposition on or near the wall. As wall deposits increase in thickness with continued processing, the wall deposits can flake off creating particle contaminants. Additionally, because the wall deposits can have different electrical and chemical properties than the wall itself, the deposits can change how the plasma interacts with the wall and can cause a change in the plasma properties over time. The wall deposits must therefore be periodically removed. In-situ plasma cleaning is preferable, but often difficult or very slow due to the low energy of some plasma-wall interactions. Thus, manual cleaning of the reactor is often required, which increases operational costs and reduces system throughput.

FIG. 1 illustrates a cross-sectional side view of a prior art plasma reactor. The apparatus employs a chamber housing 110 that forms a reactor or chamber 100. Disposed within the top of the housing 110 is a first electrode 112. As shown, the first electrode 112 and the housing 110 are coupled electrically to ground 134. A second electrode 114 is disposed within the lower part of the housing 110, opposite and parallel to the upper electrode 112. The second electrode 114 is electrically isolated from the housing 110 by an insulator ring 116. A substrate or wafer 118 to be etched is placed on an interior face of the second electrode 114, which is often configured with a clamping device and/or a cooling device. The wafer 118 is surrounded by a thin plate 120 fabricated of an insulator material such as quartz.

Etchant gas is supplied to the reactor 100 by an etchant gas supply 122 and a supply line 124. The supply line 124 is connected to the reactor 100 via a port through the first electrode 112 to deliver an etchant gas to the interior of the reactor 100. A reduced pressure is maintained within the reactor 100 by a vacuum pump 128, which is connected to the reactor 100 through a vacuum line 126. Radio Frequency (RF) power is supplied to the second electrode 114 by an RF power supply 130 and an impedance matching network 132.

At the appropriate reduced pressure of etchant gas within the reactor 100 and the application of an appropriate RF power to the second electrode 114, a plasma is formed in the inter-electrode volume 146 between the first electrode 112 and the second electrode 114, and expands to the volume 142 outside the first and the second electrodes 112 and 114. The plasma gas within the volume 142 can interact with exposed interior walls 144 of the chamber housing 110.

Others have attempted to confine plasma proximate to the wafer 118. Some known devices employ two or more annular rings 150 immediately about the inter-electrode volume 146 between two parallel disk electrodes similar to those illustrated in FIG. 2. Added to the reactor 100 of FIG. 1 are multiple annular rings 150 that fill the volume between the upper electrode 112 and lower electrode 114 about their periphery. The annular rings 150 are fabricated from a non-electrically-conductive material, such as quartz, and have small gaps 152 between them. The gaps 152 allow gas to flow from the inter-electrode volume 146 to an outer volume 148, and then to the vacuum pump 128. The gaps 152 are sufficiently narrow and the width of the annular rings 150 sufficiently wide that there is a significant loss of gas flow conductance through the small gaps 152.

This gas flow conductance loss creates a pressure differential between the inter-electrode volume 146 and the outer volume 148. The plasma created within the inter-electrode volume 146 is confined to the inter-electrode volume 146 due to the narrow gaps 152 and the very low pressure that exists in the outside volume 148.

The above-described approach to plasma confinement can suffer from a limited processing window. At low plasma operating pressures, generally less than 60 millitorr, the efficacy of the annular rings 150 cannot always establish a beneficial pressure drop. In addition, in instances where the plasma is confined, the low gas flow conductance created by the annular rings 150 limit the gas flow rates that can be employed.

If a plasma can be confined to a volume proximate the wafer, several advantages are gained including enhanced process stability and repeatability, and reduced system maintenance. Accordingly, there is a need for an apparatus and a method that confines the plasma to a volume proximate the wafer while not significantly restricting the pressures and/or gas flow rates of the apparatus and method.

BRIEF DESCRIPTION OF THE DRAWINGS

In the figures, like reference numerals designate corresponding parts throughout the views.

DETAILED DESCRIPTION OF THE PRESENTLY PREFERRED EMBODIMENTS

Presently preferred embodiments of the apparatus and method of the present invention described below confine a plasma to a volume proximate a wafer and minimize the surface areas with which the plasma interacts. Presently preferred embodiments further provide a high conductance for the flow of gases out of an inter-electrode volume. The presently preferred apparatus and method utilize a confinement method that substantially confines electric fields to a plasma region of a chamber. The presently preferred apparatus and method may be a unitary part of, or integrated within many plasma-processing systems. The presently preferred apparatus and method substantially minimize plasma-wall interactions, reduce system maintenance, improve process stability, and decrease system-to-system variations.

Figure 1:
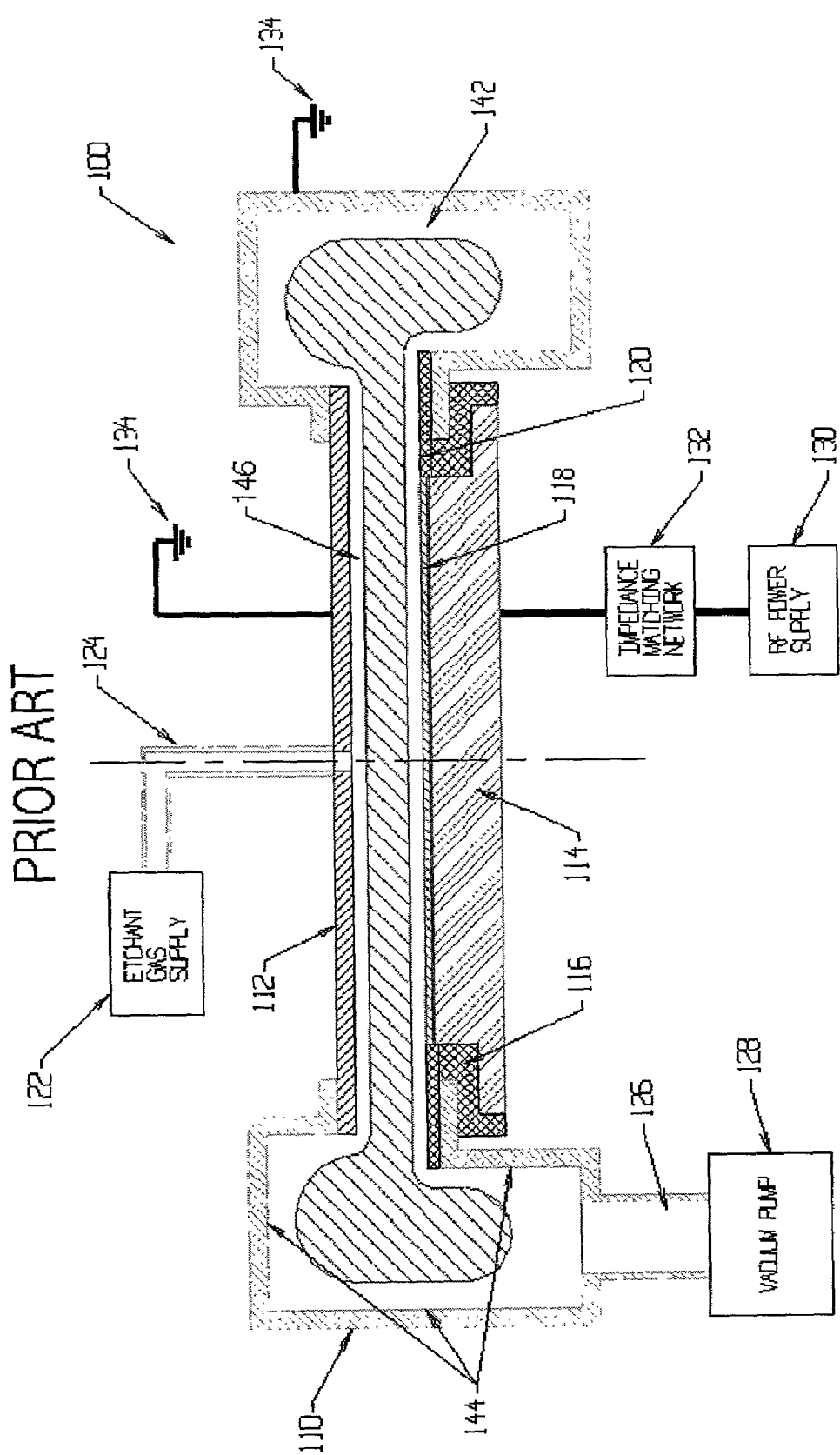
FIG. 1 is a cross-sectional side view of a prior art reactor.
Figure 2:
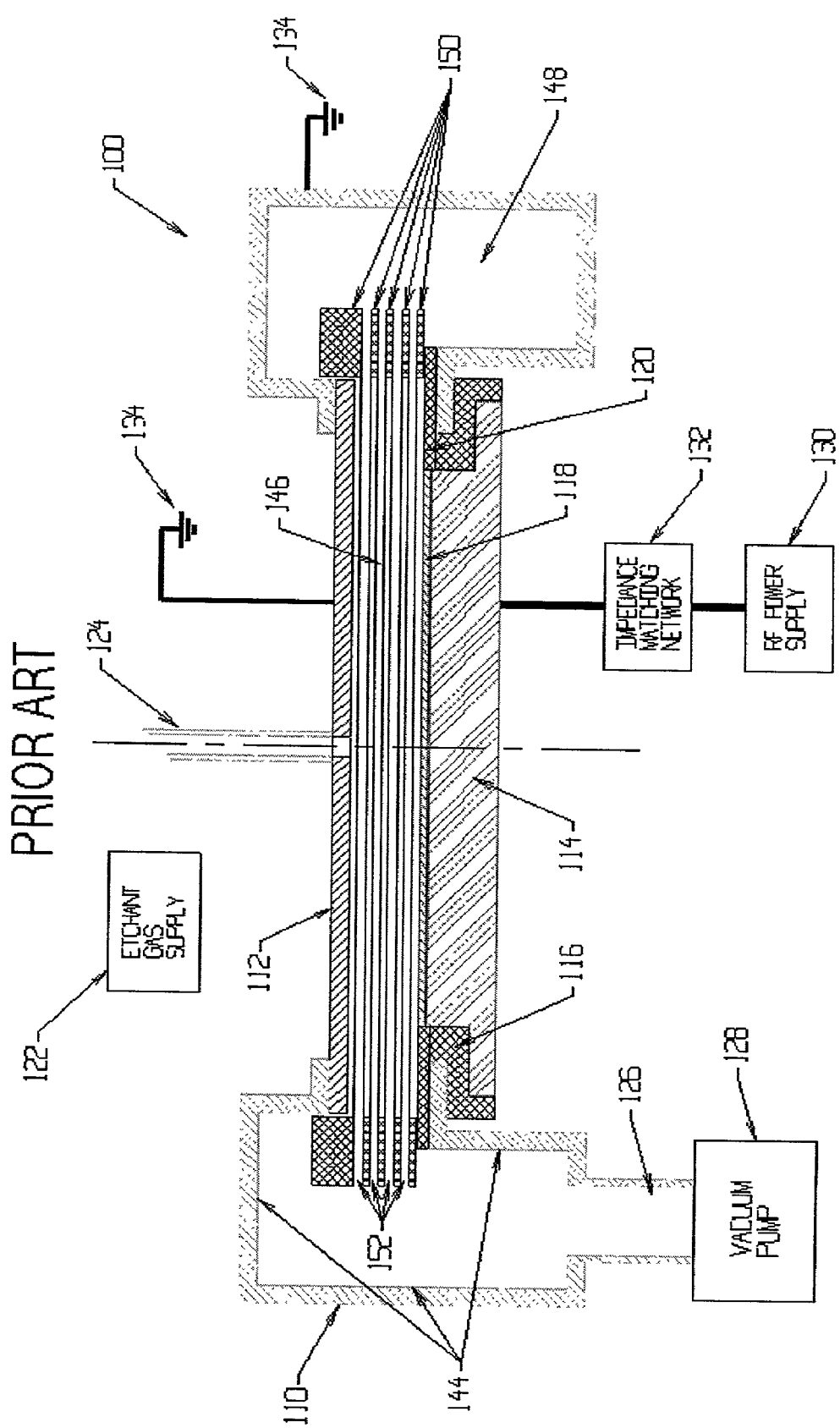
FIG. 2 is a cross-sectional side view of a second prior art reactor.
Figure 3:
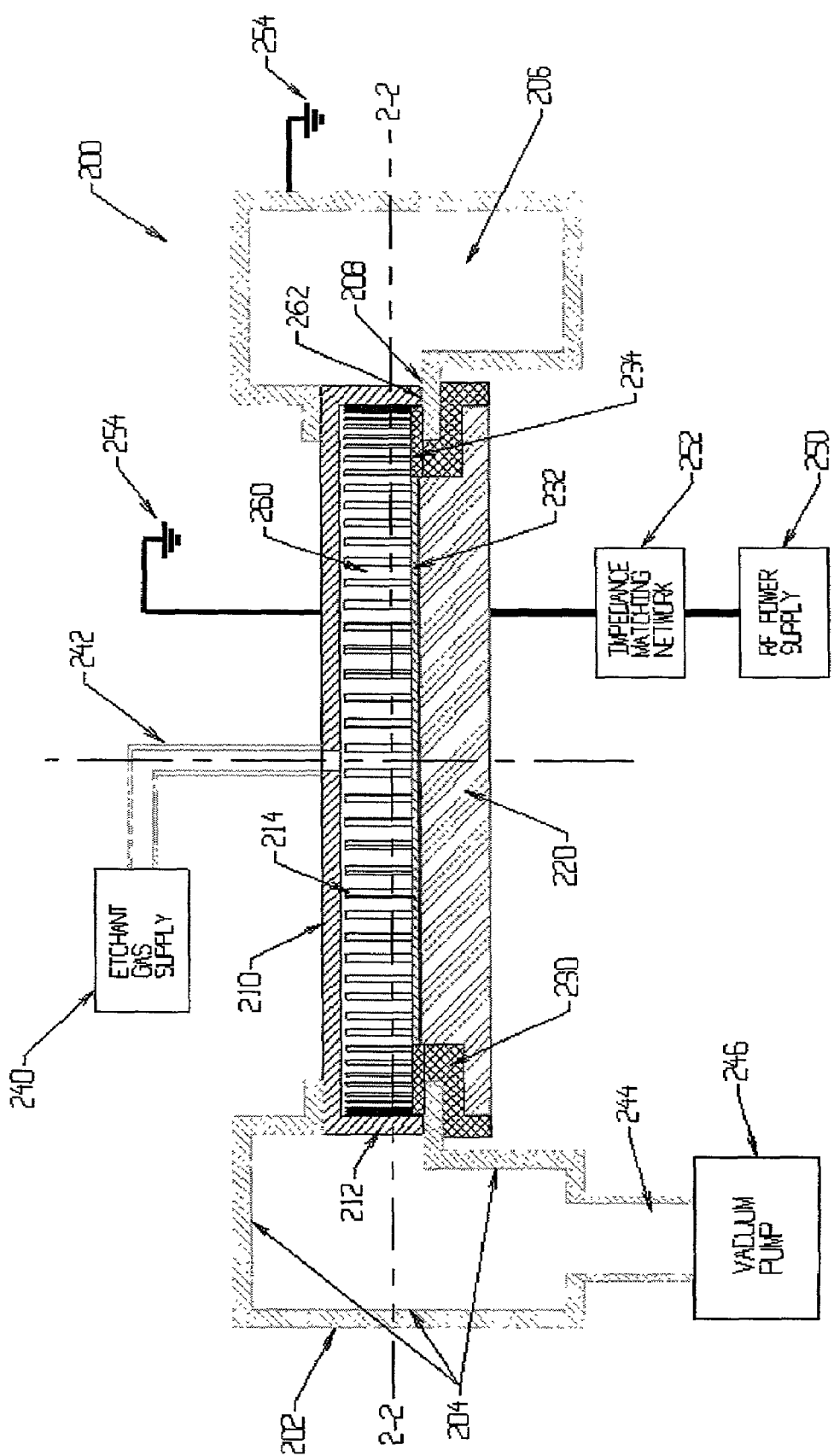
FIG. 3 is a cross-sectional side view of a presently preferred embodiment.
Figure 4:
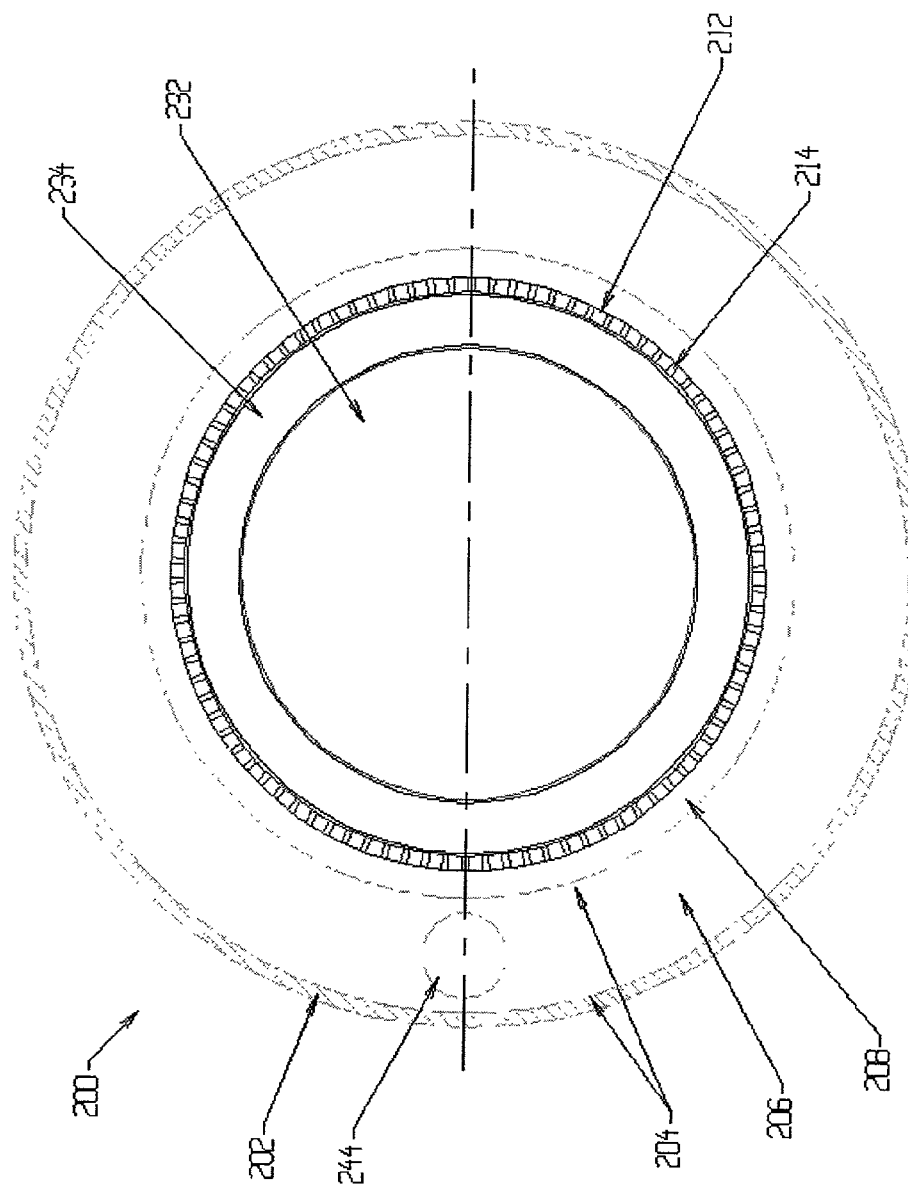
FIG. 4 is a cross-sectional top view taken along line 2—2 of FIG. 3.

Referring to FIGS. 3 and 4, the apparatus preferably employs a chamber housing 202 that forms a reactor or chamber 200. Disposed within a top portion of chamber housing 202 is a first electrode 210. In one presently preferred embodiment, the first electrode 210 can have a disc shape and can be made of silicon (Si) or silicon carbide (SiC), preferably having a resistivity of less than 1 ohm/cm. The first electrode 210 and the chamber housing 202 are electrically coupled to ground 254. A second electrode 220 is disposed within a lower portion of the chamber housing 202, opposite and substantially parallel to the first electrode 210. The second electrode 220 preferably has a disc shape. In alternative preferred embodiments, the first and second electrodes 210 and 220 can assume many other shapes and may be made from many other materials. Preferably, the separation between the first and the second electrodes 210 and 220 can be manually or automatically adjusted. Preferably, the second electrode 220 is electrically isolated from the chamber housing 202 by an insulator ring 230, which is fabricated from a non-electrically-conductive solid material such as quartz ($SiO_2$) or alumina ($Al_2O_3$). A substrate or wafer 232 to be etched is supported on an interior face or surface of the second electrode 220, which is preferably configured with means for clamping the wafer 232 to that interior face and means for controlling the temperature of the wafer 232. Such means for clamping and controlling temperature can include, but are not limited to, electrostatic clamping and a liquid-cooled second electrode 220 used together with a helium (He) gas disposed between the wafer 232 and the second electrode 220 to enhance the thermal conductance between the wafer 232 and the second electrode 220. Preferably, a focus ring 234, fabricated of an insulator material such as quartz ($SiO_2$), is configured about the wafer 232. In alternative preferred embodiments, the focus ring 234 may be comprised of two substantially concentric and proximate rings, an inner ring fabricated from silicon (Si) or silicon carbide (SiC) and an outer ring fabricated of quartz ($SiO_2$). In other alternative preferred embodiments, the focus ring 234 can have many other shapes and can be made from many other materials.

Etchant gas is supplied to the chamber 200 through an etchant gas supply 240 and a supply line 242. The supply line 242 is preferably connected to the chamber 200 through one or more ports passing through the first electrode 210, such that the etchant gas is uniformly dispersed within the inter-electrode volume 260. Gases are exhausted from the chamber 200 and a vacuum pressure is maintained by a vacuum pump 246. Preferably the vacuum pump 246 is connected to the reactor by a vacuum line 244. Preferably, radio frequency (RF) power is supplied to the second electrode 220 by an RF power supply 250 coupled to the second electrode 220 through an impedance matching network 252.

Preferably, the outer edge of the first electrode 210 projects downward and forms a cylindrical wall or "shroud" 212 about the inter-electrode volume 260. Preferably, the shroud 212 has a bottom face portion 262 that is substantially adjacent to a face of the focus ring 234 or an upper edge 208 of the chamber 200. Preferably, the bottom face portion 262 of the shroud 212 makes electrical contact with the upper edge 208 of the chamber 200. Preferably, the electrical connection creates an alternate and shorter RF conductive path from the RF power supply 250 to ground 254 when compared to the conductive path from the RF power supply 250 to ground 254 through the walls 204 of the chamber 200. The shroud 212 minimizes electric and magnetic field strength enclosed within an outer chamber volume 206 and improves plasma confinement.

Preferably, the shroud 212 is configured with a plurality of holes or substantially vertical slots 214 that completely penetrate or pass through the shroud 212 and allow the etchant gas within the inter-electrode volume 260 to be exhausted. Preferably, the substantially vertical slots 214 are vertically oriented and are about 0.8 to about 3.0 millimeters wide. In alternative preferred embodiments, the substantially vertical slots 214 may assume many other shapes and have many other widths.

The number, shapes, and size of the substantially vertical slots 214 and thickness of the shroud 212 preferably are selected to achieve a desired gas flow conductance or gas residence time within the inter-electrode volume 260 and yet, not allow the plasma to become unconfined. In this preferred embodiment, the substantially vertical slots 214 comprise 180 substantially vertical slots about 2.5 millimeters wide by the full length of the about 20 millimeter inter-electrode gap. The wall of the shroud 212 is about 6 millimeters thick. In other preferred embodiments the number, shape, and size of the openings can vary, as can the thickness of the shroud 212.

At a proper pressure level of etchant gas within the inter-electrode volume 260 and upon the application of an appropriate RF power to the second electrode 220, a plasma is formed within the inter-electrode volume 260. Preferably, the plasma is confined by the shroud 212 and plasma-surface interactions are restricted to a relatively small and a well-defined area. In exemplary embodiments capable of etching about 200 millimeter wafers, the shroud 212 preferably has a height within a range of about 14 to about 25 millimeters. The inner diameter (ID) of the shroud 212 is about 220 millimeters inches and an outer diameter (OD) of the shroud 212 is about 235 millimeters. The substantially vertical slots 214 have widths of about 2.0 millimeters and lengths of about 12 to about 24 millimeters that are spaced about every 2.0 degrees. In these exemplary embodiments, the first electrode 210 and a unitary shroud 212 are comprised of silicon (Si) or silicon carbide (SiC). Moreover, a 3000 Watt 27 MHz RF power supply in combination with a 3000 Watt 2 MHz RF power supply was used. In other preferred embodiments, including those embodiments that are capable of etching about 200 millimeter and/or about 300 millimeter wafers, the width, the diameters, dimensions of the substantially vertical slots, and the material used to make the shroud 212 can vary. Moreover, the frequencies and RF power levels can also vary.

Figure 5:
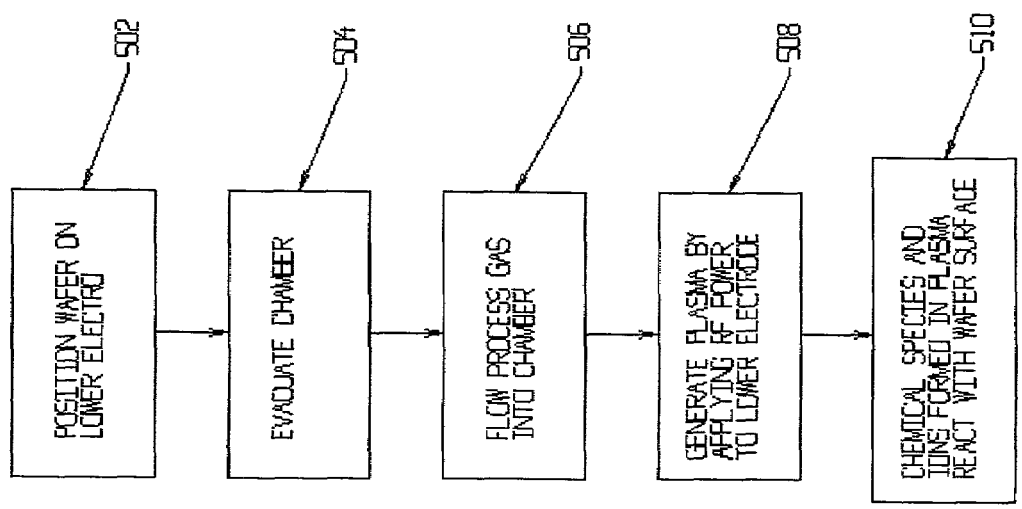
FIG. 5 is a flow diagram of FIG. 3.

In operation, the wafer 232 is positioned on an inner surface or face of the second electrode 220 as described at act 502 of FIG. 5. At act 504, the chamber 200 is evacuated at act 504. A means for clamping, such as a wafer clamping ring or an electrostatic charge, for example, secures the wafer 232 to the second electrode 220. Process gas is supplied through the distribution source 240 at act 506. The process gas enters the inter-electrode volume 260 via the gas supply line 242 and a distribution device such as a showerhead. A selected pressure in the inter-electrode volume 260 is attained by controlling the rate of process gas introduction and/or the rate of gas removal. A pump, such as a mechanical vacuum pump (e.g., a turbo pump) removes the process gas from the inter-electrode volume 260 via an exhaust port and vacuum line 244.

Preferably, RF power is applied to the second electrode 220, which creates a high-energy electric field within the inter-electrode volume 260 and generates plasma at act 508. Thereafter, the plasma reacts with the exposed surface of the wafer 232 at act 510. It should be noted that the acts illustrated in FIG. 5 may be reordered and/or may include additional acts before or after the illustrated acts.

Preferably, the shroud 212 substantially terminates electric fields formed within the inter-electrode volume 260, which prevents the electric fields from penetrating the exterior chamber volume 206. The substantially vertical slots 214 within the shroud 212 allow the process gas to flow with a minimal pressure loss between the inter-electrode volume 260 and the vacuum line 244, making high gas flow rates at low process pressures attainable.

In some exemplary embodiments, the shroud 212 effectively modifies the electric fields about the wafer 232 and modifies the process. In some oxide etch applications for example, the shroud 212 increases the etch rate at the outer edge of the wafer 232. One advantage of this preferred embodiment is that an improved etch rate uniformity across the wafer 232 can be attained.

Given that the shroud 212 substantially terminates the electric field near the periphery of the inter-electrode volume 260 with a limited resistance to gas flow, the shroud 212 encompasses any structure that achieves that function. Accordingly, the shroud 212 is not limited to containment structures having only substantially vertical slots 214. In alternative preferred embodiments, the shroud 212 includes substantially horizontal slots that in some instances are substantially parallel to the faces or interior surfaces of the first and second electrodes 210 and 220. The shroud 212 can also include perforations, gaps, and/or any other suitable arrangement and combination of holes, slots, gaps, channels, etc., of uniform or non-uniform cross section that allow process gas to flow from the inter-electrode volume 260 to the vacuum line 244. Preferably, the shroud 212 achieves a maximum gas conductance. Moreover, since the shroud 212 is at a ground potential, the size of the first electrode 210 can be decreased without substantially changing the electrical state of the plasma formed within the inter-electrode volume 260.

Figure 6:
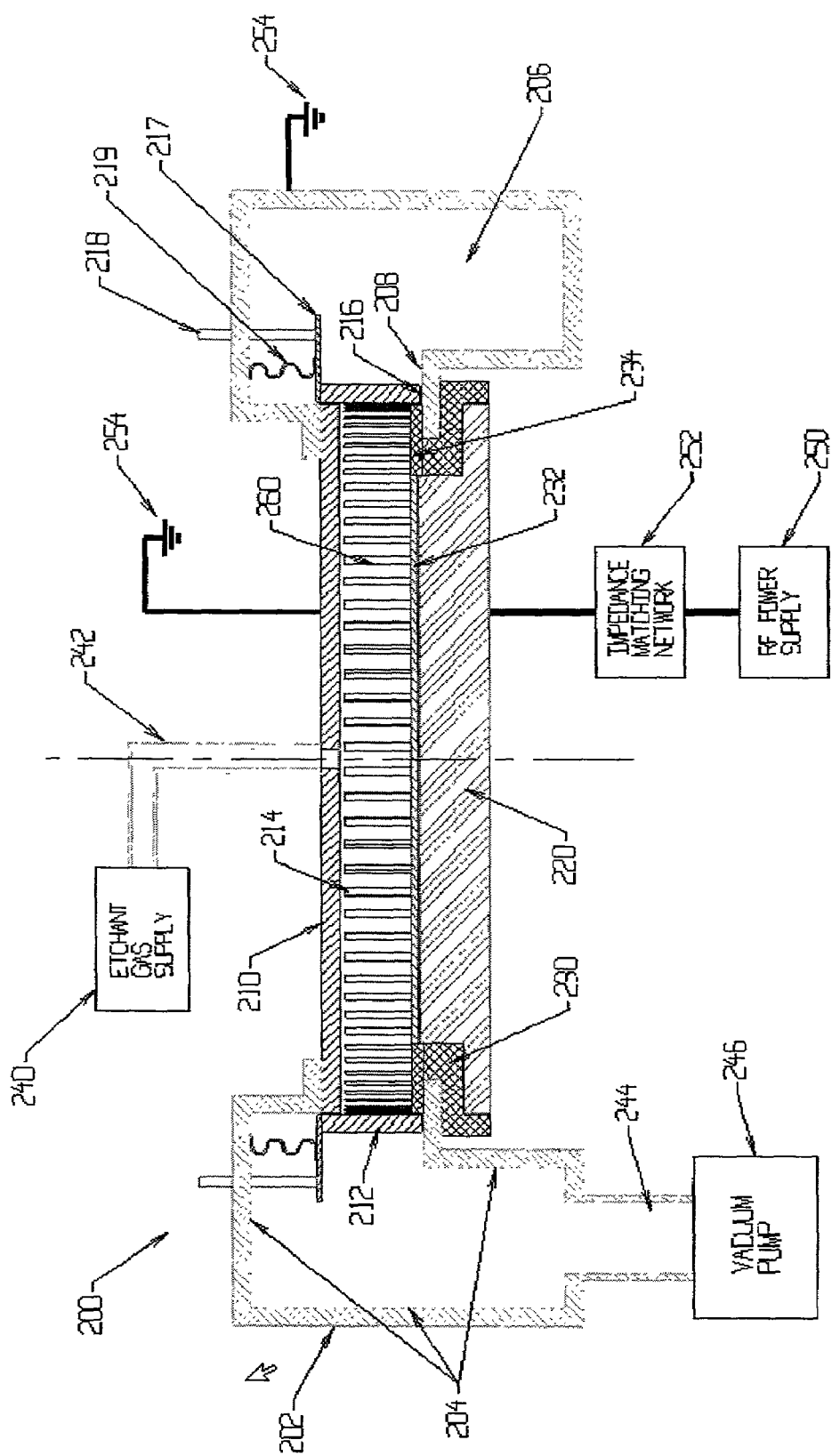
FIG. 6 is a cross-sectional side view of an alternative presently preferred embodiment.

From the forgoing description, it should be apparent that the shroud 212 may be a unitary part of, or separate from, but electrically coupled to, the first electrode 210. Preferably, the shroud 212 is moveable, meaning the shroud 212 can be manually or automatically raised or lowered with respect to the second electrode 220 even while the apparatus and method are operating. As depicted in FIG. 6, the shroud 212 is physically separate from the first electrode 210 and is mechanically and electrically connected to a plate 217. Three or more lift pins 218 are attached equally about the plate 217 and facilitate the raising and lowering the shroud 212. Preferably, six or more flexible electrically conductive straps 219 provide electrical contact between the plate 217 and the chamber 200. In the preferred embodiment, when the shroud 212 is moved to a lowermost position, a lower surface 216 of the shroud 212 makes mechanical and electrical contact with the upper edge 208 of the chamber 200. These contacts create an alternate and shorter RF return path from the RF power supply 250 to ground 254 when compared to the RF return path from the power supply 250 to ground 254 that comprises walls 204 of the chamber 200. The shorter conduction path to ground 254 minimizes electric and magnetic field strength in the outside chamber volume 206 and improves plasma confinement.

Figure 7:
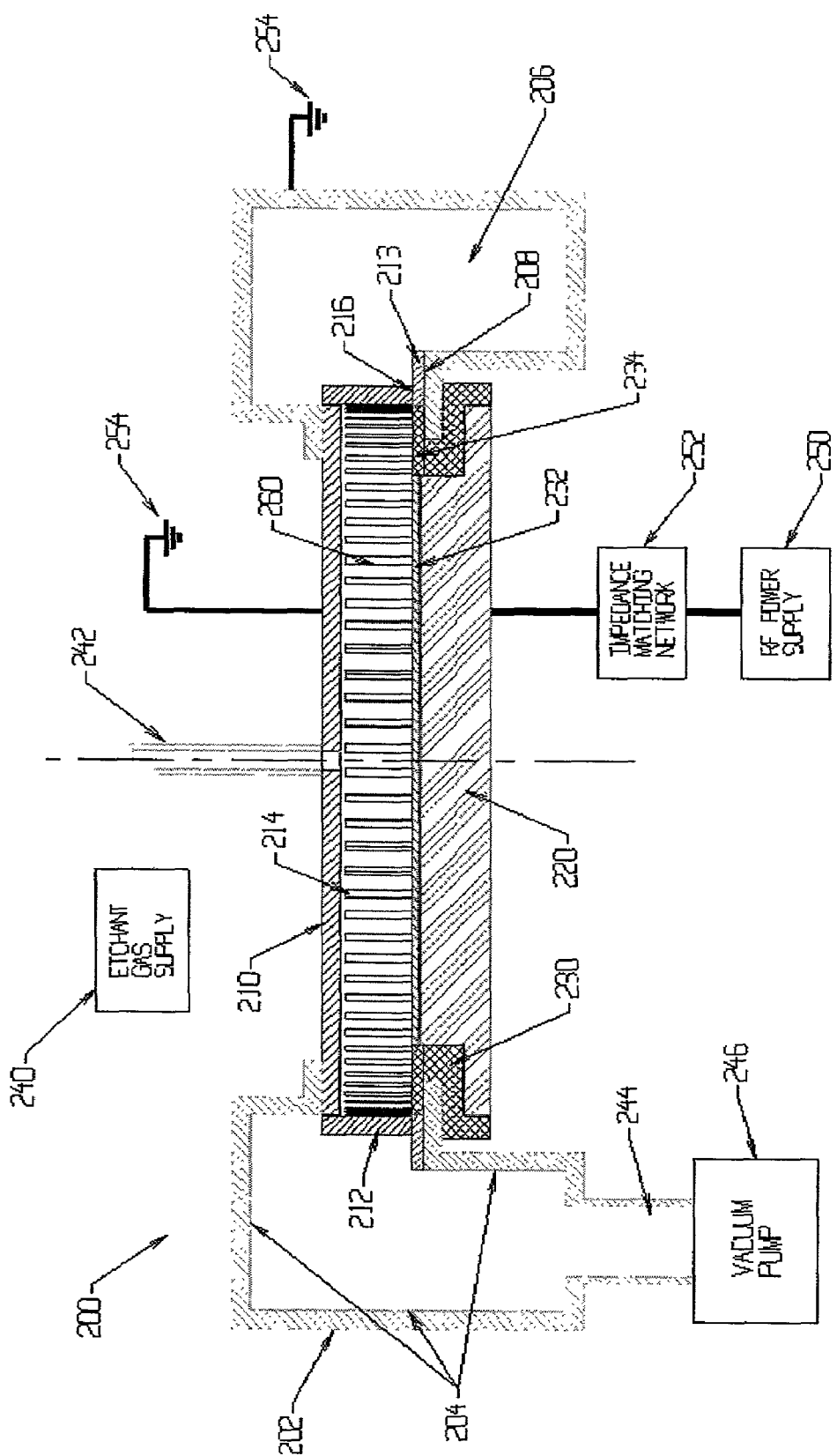
FIG. 7 is a cross-sectional side view of a second alternative presently preferred embodiment.

As shown in FIG. 7, the shroud 212 can also be physically separate from the first electrode 210 and mechanically and electrically connected to a lower half of the chamber 200 near the second electrode 220. Preferably, the lower surface 216 of the shroud 212 is mechanically and electrically coupled to a conductive ring 213. Preferably, the conductive ring 213 is mechanically and electrically coupled to the upper edge 208 of the chamber 200.

Figure 8:
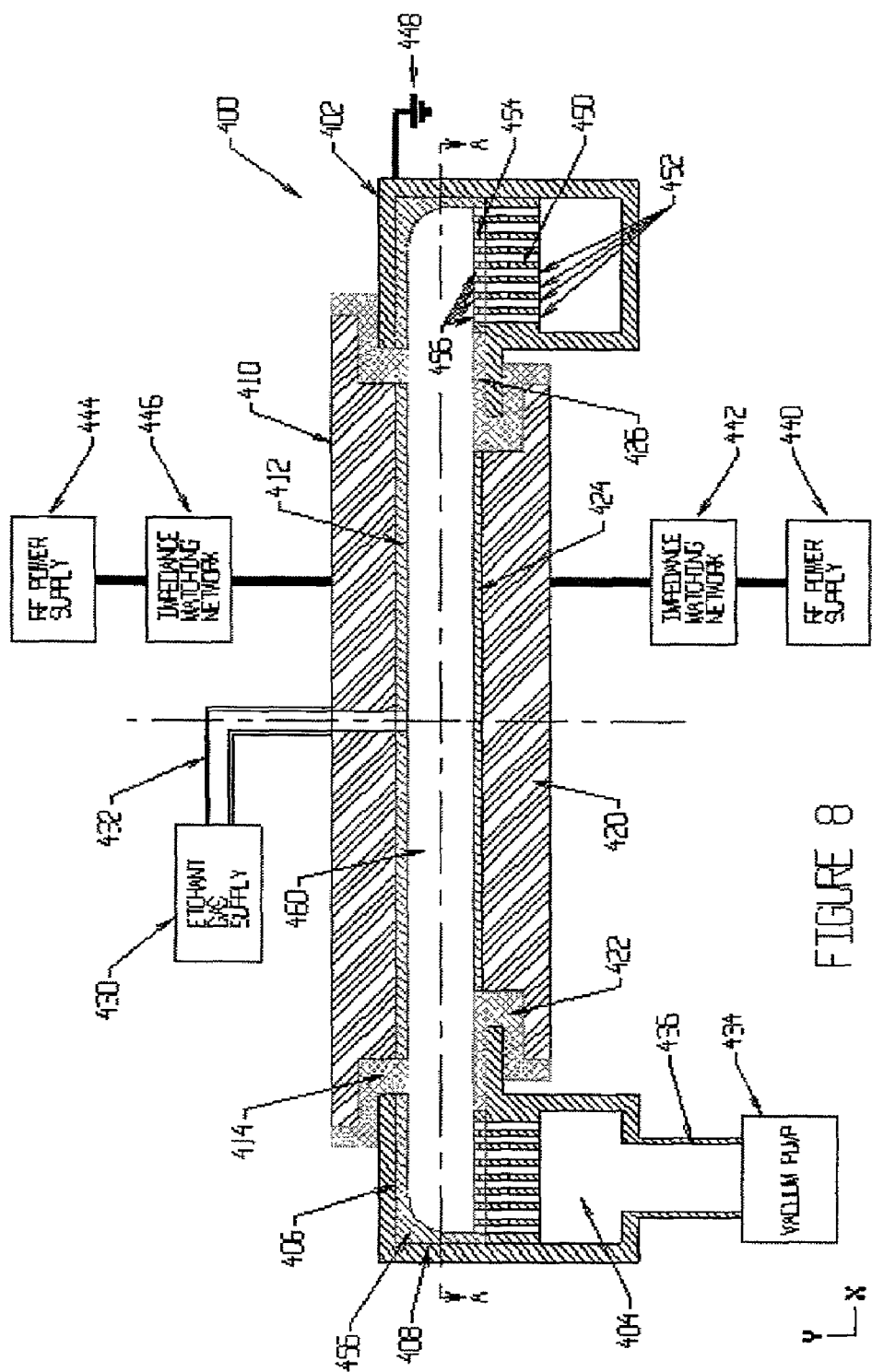
FIG. 8 is a cross-sectional side view of a third alternative presently preferred embodiment.
Figure 9:
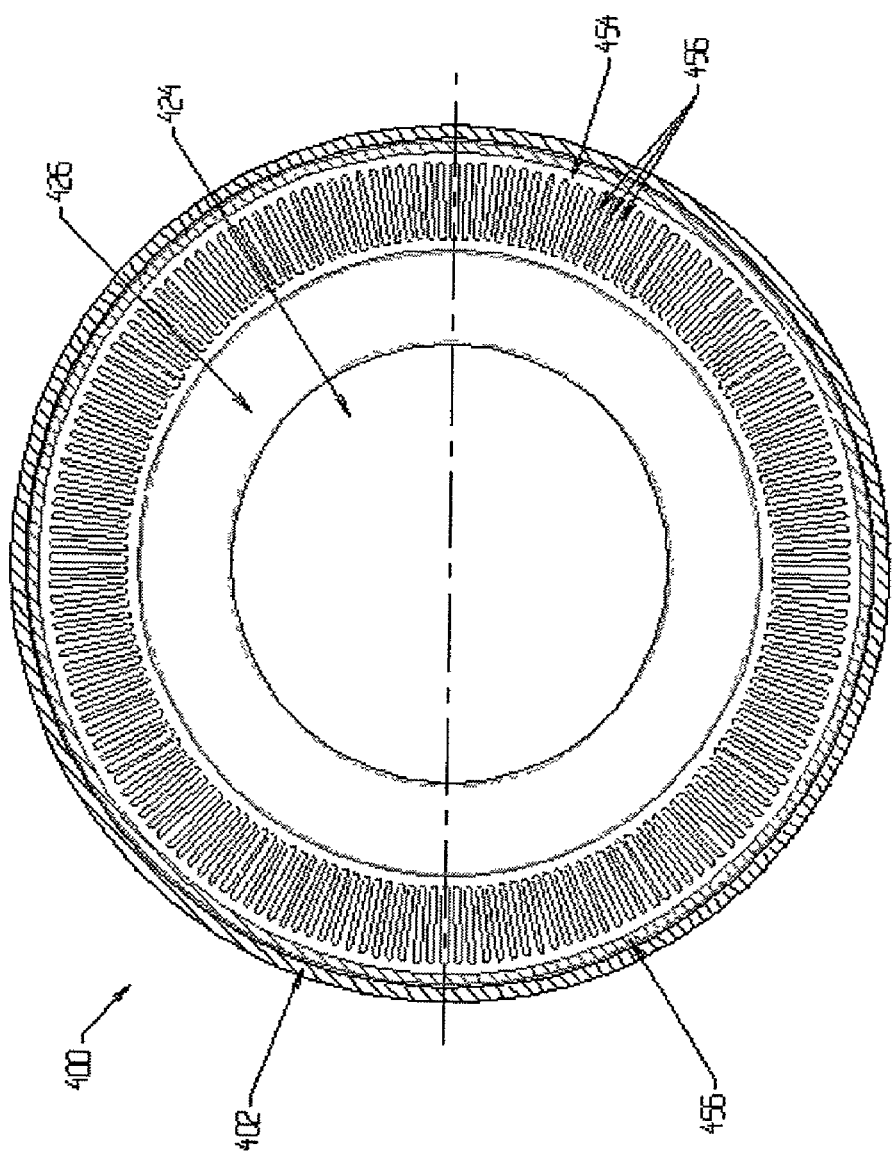
FIG. 9 is a cross-sectional top view taken along line A—A of FIG. 8.
Figure 10:
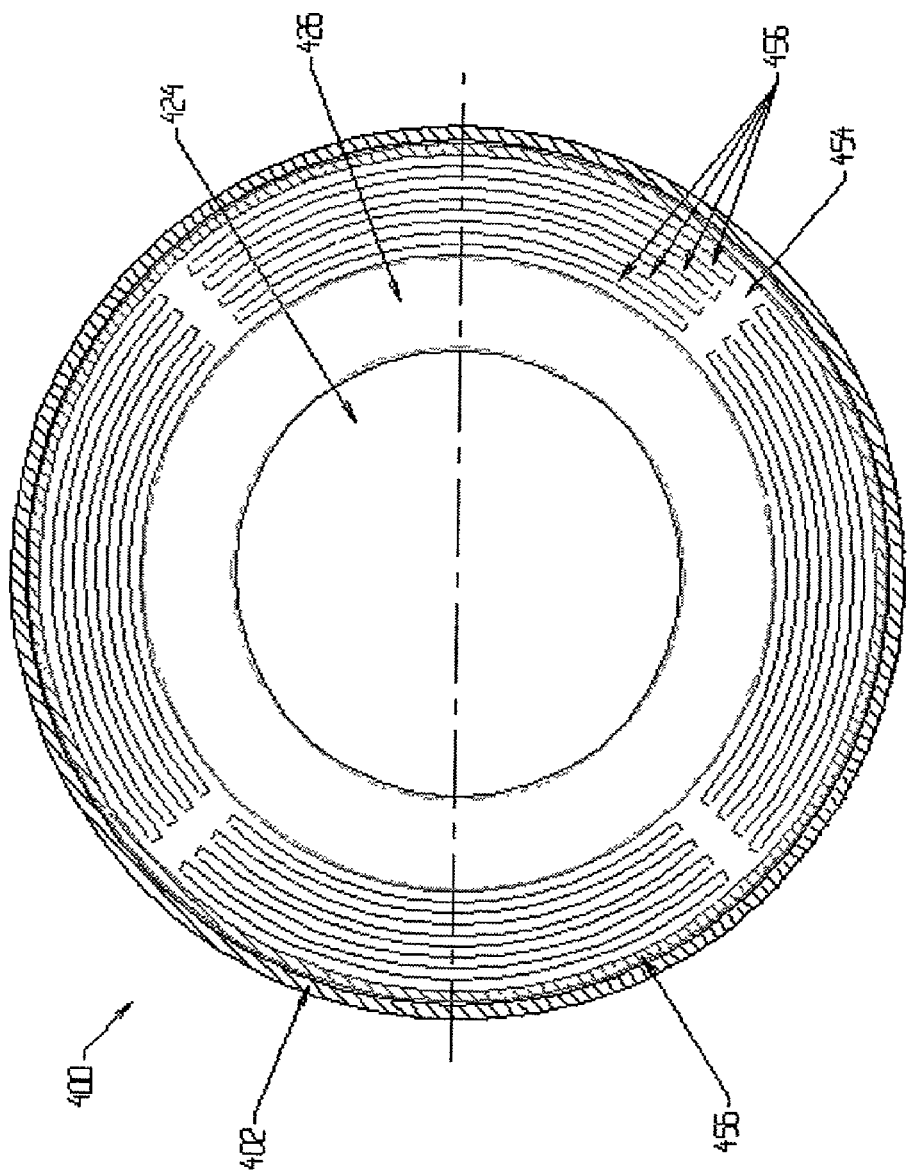
FIG. 10 is a cross-sectional top view taken along line A—A of an alternative presently preferred embodiment of FIG. 8.

FIG. 8 depicts another alternative preferred embodiment of a shroud 450 enclosed within a plasma reactor incorporating two independently RF powered electrodes. Such reactors can be referred to as "triodes" (2 RF powered electrodes and a grounded surface). Referring to FIGS. 8, 9, and 10, a triode reactor 400 is comprised of a chamber 402, an upper electrode 410, and a lower electrode 420. Preferably the chamber 402 is electrically coupled to an electrical ground 448. Preferably, the upper electrode 410 is electrically isolated from the chamber 402 by an upper insulator ring 414. The upper electrode 410 preferably has a plate 412 of silicon (Si), silicon carbide (SiC), or other suitable material mechanically and electrically coupled to the chamber 402 interior faces. The upper electrode 410 is coupled to an RF power supply 444 through an impedance matching network 446.

Preferably, the lower electrode 420 is electrically isolated from the chamber 402 by the lower insulator ring 422 and preferably incorporates means for mechanically or electrically holding and cooling a substrate or wafer 424 positioned on the lower electrode 420 interior face that were described above. A focus ring 426 comprised of electrically insulating material is preferably situated about the wafer 424. RF power is supplied to the lower electrode 420 by an RF power supply 440 and an impedance matching network 442.

Etchant gas is supplied to the reactor 400 by means of an etchant gas supply 430 and a supply line 432. The supply line 432 is preferably connected to the reactor 400 through one or more ports passing through the upper electrode 410, such that the etchant gas is delivered uniformly to an inter-electrode volume 460. Gases are exhausted from the reactor 400 and a vacuum level is maintained within the chamber 402 by a vacuum pump 434, which is connected to the reactor 400 through a vacuum line 436.

Preferably, the shroud 450 is positioned in an annular space about the lower electrode 420, such that the shroud 450 forms a barrier between the inter-electrode volume 460 and a volume 404 positioned within the lower half of the chamber 402. Preferably, the shroud 450 is mechanically and electrically coupled to the chamber 402 at portions about the shroud's 450 inner and outer circumference. Preferably, the shroud 450 includes a plurality of slots or holes 452 through which the process gas may pass easily but whose dimensions are sufficient to effectively terminate all electric fields formed within the plasma volume 460, such that substantially no electric fields exist in the lower portion 404 of the chamber 402. Preferably, these slots 452 are about 0.8 to about 3.0 millimeters wide and the shroud 450 is about 6 to about 12 millimeters thick. The orientation of the slots 452 may extend radially, extend circumferentially, or extend in any other suitable direction.

As shown in FIGS. 9 and 10, the respective radially and circumferentially extending slots of the shroud 450 are aligned with radially and circumferential extending slots 456, respectively, of a cover plate 454. As shown in FIGS. 9 and 10, the shroud 450 can be a unitary part of the cover plate 454, although in alternative preferred embodiments the shroud 450 and the cover plate 454 can be separate components. Preferably the slots 456 of the cover plate 454 align with the slots 452 of the shroud 450. Preferably, the cover plate 454 is fabricated from silicon (Si), silicon carbide (SiC) or other suitable material.

The foregoing detailed description describes only a few of the many forms that the present invention can take and should therefore be taken as illustrative rather than limiting. It is only the following claims, including all equivalents that are intended to define the scope of the invention.

What is claimed is:

1. A plasma processing apparatus comprising:
    an electrical ground;
    a vacuum chamber coupled to the electrical ground;
    a first electrode disposed within the vacuum chamber having a substantially planar surface facing an interior of the vacuum chamber coupled to the electrical ground;
    a second electrode disposed in the vacuum chamber having a substantially planar surface proximate and parallel to the first electrode;
    a power supply coupled to the second electrode;
    a containment device positioned about the periphery of the first and the second electrodes within the vacuum chamber, the containment device enclosing substantially all of an inter-electrode volume between the first and second electrode and comprising a cylindrical shroud having a plurality of openings, each opening extending substantially a length of an inter-electrode gap between the planar surfaces of the first and the second electrodes and facilitating gas flow and being electrically coupled to the electrical ground; and
    a supply line configured to channel a process gas directly through the first electrode and exit through an open circumference of the containment device.

2. The plasma processing apparatus of claim 1 wherein the containment device comprises a unitary part of the first electrode.

3. The plasma processing apparatus of claim 1 wherein the containment device comprises an integrated part of the first electrode.

4. The plasma processing apparatus of claim 1 wherein the containment device is positioned adjacent to the second electrode.

5. The plasma processing apparatus of claim 1 wherein the openings in the containment device comprise substantially vertical slots.

6. The plasma processing apparatus of claim 1 wherein the plurality of openings in the containment device comprise substantially horizontal slots.

7. The plasma processing apparatus of claim 1 wherein the containment device is adjustably positioned relative to the second electrode such that the containment device can be moved closer to and further away from the planar surface of the second electrode.

8. An etch apparatus, comprising:
    an electrical ground;
    a plasma chamber coupled to the electrical around;
    a vacuum pump coupled to the plasma chamber;
    a process gas source coupled to the plasma chamber;
    a first electrode having a substantially planar surface facing an interior of the plasma chamber and coupled to the electrical ground;
    a second electrode having a substantially planar surface facing and substantially parallel to the first electrode;
    a power source coupled to the second electrode;
    an inter-electrode region disposed between the first and the second electrode;
    a containment device enclosed within the plasma chamber and electrically coupled to the first electrode, the containment device forms a periphery of the inter-electrode region and having a plurality of elongated slots extending substantially between the planar surface of the first electrode and the planar surface of the second electrode and configured to facilitate gas flow between the inter-electrode region and a flow path terminating at an input to the vacuum pump and having conductive portions that substantially confine electric fields to the inter-electrode region; and
    a supply line configured to channel a process gas directly through the first electrode and through an open circumference of the containment device.

9. The etch apparatus of claim 8 wherein the slots of the containment device comprise substantially vertical slots that extend between the substantially planar surfaces of the first and the second electrodes.

10. The etch apparatus of claim 8 wherein the slots of the containment device comprise substantially horizontal slots.

11. The etch apparatus of claim 8 wherein the containment device is configured to confine a plasma within the containment device.

12. The etch apparatus of claim 8 wherein the containment device is mechanically coupled to the first electrode.

13. The etch apparatus of claim 8 wherein the containment device comprises a unitary part of the first electrode.

14. The etch apparatus of claim 8 wherein the containment device is configured to confine a plasma to the inter-electrode region with minimal restriction to the flow of gas between the inter-electrode region and a remaining chamber volume.

15. The etch apparatus of claim 8 wherein the flow path is further defined by inner chamber walls and an exhaust port.

16. The etch apparatus of claim 8 wherein the containment device is positioned around a peripheral portion of the first electrode.

17. The etch apparatus of claim 8 wherein the containment device is positioned around a peripheral portion of the first and the second electrodes.

18. The etch apparatus of claim 8 wherein the slots have a uniform cross section.

19. The etch apparatus of claim 8 wherein the slots have a non-uniform cross section.

20. The etch apparatus of claim 8 wherein the power supply is a radio frequency power supply.

21. The etch apparatus of claim 8 wherein the power supply comprises two radio frequency power supplies having different radio frequency ratings.

22. The etch apparatus of claim 21 wherein the frequency ratings of the two radio frequency power supplies are 2 Megahertz and 27 Megahertz, respectively.

23. The etch apparatus of claim 8 wherein the surface of the first electrode is comprised of silicon.

24. The etch apparatus of claim 23 wherein the silicon has a resistivity of about 1 ohm/cm.

25. The etch apparatus of claim 8 wherein the surface of the first electrode is comprised of silicon carbide.

26. The etch apparatus of claim 25 wherein the silicon carbide has a resistivity of about 1 ohm/cm.

27. The plasma processing apparatus of claim 1 further comprising a supply line coupled directly to the inner-electrode volume enclosed by the containment device.

28. The etch apparatus of claim 8 wherein the open circumference of the containment device is positioned around a peripheral portion of the first electrode and a second open circumference of the containment device is positioned around a peripheral portion of the second electrode.

29. The etch apparatus of claim 23 wherein the silicon has a resistivity of less than 1 ohm/cm.

30. The etch apparatus of claim 25 wherein the silicon carbide has a resistivity of less than 1 ohm/cm.

31. The plasma processing apparatus of claim 5 wherein the substantially vertical slots are about 0.8 to about 3.0 millimeters wide.

32. The etch apparatus of claim 8 wherein the slots are about 0.8 to about 3.0 millimeters wide.

33. The plasma processing apparatus of claim 31 wherein the substantially vertical slots are about 12 to about 24 millimeters in length.

34. The etch apparatus of claim 32 wherein the slots are about 12 to about 24 millimeters in length.

35. The plasma processing apparatus of claim 33 wherein the cylindrical shroud is about six millimeters thick.

36. The etch apparatus of claim 34 wherein the containment device is about six millimeters thick.

37. A plasma processing apparatus comprising:

an electrical ground;

a vacuum chamber coupled to the electrical ground;

a first electrode disposed within the vacuum chamber having a substantially planar surface facing an interior of the vacuum chamber and coupled to the electrical ground;

a second electrode disposed in the vacuum chamber having a substantially planar surface proximate and parallel to the first electrode;

a power supply coupled to the second electrode; and a containment device positioned about the periphery of the first and the second electrodes within the vacuum chamber, the containment device enclosing substantially all of an inter-electrode volume between the first and second electrode and comprising a cylindrical shroud having a plurality of elongated openings, each of the plurality of elongated opening extending substantially from the planar surface of the first electrode to the planar surface of the second electrode and are configured to facilitate gas flow and being electrically coupled to the electrical ground.

* * * * *